United States Patent
Tamura et al.

(10) Patent No.: US 6,818,382 B2
(45) Date of Patent: Nov. 16, 2004

(54) PHOTOSENSITIVE COMPOSITION, CURED ARTICLE THEREOF, AND PRINTED CIRCUIT BOARD USING THE SAME

(75) Inventors: Kenji Tamura, Kawasaki (JP);
Motoyuki Hirata, Hiratsuka (JP);
Yoshikazu Kanemaru, Tokyo (JP)

(73) Assignee: Showa Denko K.K., Tokyo (JP)

( * ) Notice: Subject to any disclaimer, the term of this patent is extended or adjusted under 35 U.S.C. 154(b) by 266 days.

(21) Appl. No.: 10/129,185

(22) PCT Filed: Sep. 10, 2001

(86) PCT No.: PCT/JP01/07826

§ 371 (c)(1),
(2), (4) Date: May 2, 2002

(87) PCT Pub. No.: WO02/23273

PCT Pub. Date: Mar. 21, 2002

(65) Prior Publication Data

US 2003/0003398 A1 Jan. 2, 2003

Related U.S. Application Data

(60) Provisional application No. 60/238,046, filed on Oct. 6, 2000, and provisional application No. 60/256,916, filed on Dec. 21, 2000.

(30) Foreign Application Priority Data

| Sep. 11, 2000 | (JP) | 2000-275704 |
| Dec. 1, 2000 | (JP) | 2000-367131 |
| Mar. 26, 2001 | (JP) | 2001-088113 |
| Sep. 5, 2001 | (JP) | 2001-268392 |

(51) Int. Cl.$^7$ ............................. G03F 7/028; G03F 7/035
(52) U.S. Cl. ......................... 430/281.1; 430/284.4; 430/288.1; 430/311; 430/320; 430/494; 523/160
(58) Field of Search ........................ 523/160; 430/281.1, 430/284.1, 286.1, 287.1, 288.1, 311, 320, 348, 494

(56) References Cited

U.S. PATENT DOCUMENTS

| 5,089,376 A | * | 2/1992 | Setthachayanon | 430/284.1 |
| 5,506,321 A | * | 4/1996 | Koto et al. | 526/273 |
| 5,776,995 A | * | 7/1998 | Obiya et al. | 522/15 |
| 2004/0009428 A1 | * | 1/2004 | Tamura et al. | 430/280.1 |

FOREIGN PATENT DOCUMENTS

| EP | 0 360 579 A1 | 3/1990 |
| EP | 0 433 081 A2 | 6/1991 |
| EP | 0 545 081 A1 | 6/1993 |
| EP | 1 008 911 A1 | 6/2000 |
| EP | 1 094 364 A1 | 4/2001 |
| WO | WO 00 56798 A | 9/2000 |

* cited by examiner

Primary Examiner—Barbara L. Gilliam
(74) Attorney, Agent, or Firm—Sughrue Mion, PLLC

(57) ABSTRACT

The photosensitive composition of the present invention comprises a photocurable component containing a urethane (meth)acrylate compound (A) having a carboxyl group; a thermosetting resin (C); a photopolymerization initiator (D); and a thermopolymerization catalyst (E); and the above-mentioned photocurable component further contains at least one of (B) a compound having an ethylenically unsaturated group, excluding the component (A), and an epoxy (meth) acrylate compound (F) having a carboxyl group. Therefore, the photosensitive composition is suitable for use as an insulating protective coating film for printed circuit boards. Since the cured film made of the photosensitive composition of the present invention is particularly superior in pliability, curling does not occur even when used for a thin circuit board. Therefore, the cured film is best suited for use in an FPC board.

27 Claims, No Drawings

PHOTOSENSITIVE COMPOSITION, CURED ARTICLE THEREOF, AND PRINTED CIRCUIT BOARD USING THE SAME

CROSS-REFERENCE TO RELATED APPLICATIONS

This application claims the benefit pursuant to 35 U.S.C. § 119(e)(1) of U.S. Provisional Applications, No. 60/238,046 filed Oct. 6, 2000, and No. 60/256,916 filed Dec. 21, 2000.

TECHNICAL FIELD

The present invention relates to a photosensitive composition used in insulating protective coating films for printed circuit boards and the like, and cured articles thereof.

BACKGROUND ART

A protective film made of polyimide or polyester has widely been used as insulating protective coating films for circuit boards. When this protective film is formed on a circuit board, an adhesive is applied on one surface of the protective film. After perforating the portion which corresponds to a terminal connection when the protective film is formed on the circuit board by means of punching, the protective film and the circuit board are laid one upon the other by hand while positioning them and then are bonded to each other at high temperature under high pressure using a heat plate.

Polyimide and polyester are suited for protection of wiring because they are pliable to some extent. However, a film must be perforated in advance by means of punching to lead a wiring terminal on the circuit board described above. Therefore, complicated wiring makes it difficult to execute positioning of the film with wiring on the board. Since the cost of the equipment such as a heat plate is high and an adhesive must be used, the cost becomes higher. Also, there was such a problem in that smearing occurs during the punching and oozing of the adhesive occurs during the pressing.

Even if a protective film having excellent heat resistance and electrical insulating properties is used as the insulating protective coating film in such a manner, the performance of the adhesive sometimes exerts an adverse effect on the insulating protective coating film, thus lowering the heat resistance and electrical insulating properties of the insulating protective coating film when the circuit board and the protective film are bonded via the adhesive.

Therefore, a method of forming the insulating protective coating film on the circuit board by means of a printing method using cover lay ink (hereinafter referred to as a "cover lay ink method") has recently been studied.

As an example of cover lay ink, for example, Japanese Patent Application, First Publication No. Sho 55-145717 discloses a composition comprising an epoxy (meth)acrylate resin and a melamine resin.

Japanese Patent Application, Second Publication No. Sho 50-4395 and Japanese Patent Application, Second Publication No. Sho 53-10636 disclose acrylic resin compositions such as sulfomethylene acrylate or phosphoric acid ethylene acrylate.

Japanese Patent Application, First Publication No. Sho 63-221172 discloses a composition containing polyaminobismaleimide and an epoxy resin as a principal component, Japanese Patent Application, First Publication No. Hei 1-121364 discloses a composition containing polyimide as a principal component, and Japanese Patent Application, First Publication No. Hei 1-256515 discloses a composition containing polyparabanic acid and an epoxy resin as a principal component, respectively.

However, the insulating protective coating film obtained by using the cover lay ink method has poor pliability, heat resistance, and electrical insulating properties, and sometimes has poor adhesion to the circuit board. Therefore, when using the insulating protective coating film in a thin circuit board such as an flexible printed circuit board (hereinafter referred to as a "FPC board"), there is a problem in that warp (hereinafter referred to as "curling" sometimes) of the FPC board is caused by a difference in thermal expansion coefficients between the circuit board and the insulating protective coating film and curing shrinkage during the formation of the insulating protective coating film.

For example, a coating film made of a composition disclosed in Japanese Patent Application, First Publication No. Sho 55-145717 has the drawback that it has poor pliability.

Coating films made of compositions disclosed in Japanese Patent Application, Second Publication No. Sho 50-4395 and Japanese Patent Application, Second Publication No. Sho 53-10636 were noticeably inferior in heat resistance.

Since all compositions disclosed in Japanese Patent Application, First Publication No. Sho 63-221172, Japanese Patent Application, First Publication No. Hei 1-121364 and Japanese Patent Application, First Publication No. Hei 1-256515 exhibit a large shrinkage factor during curing, severe curling occurs when a cover lay ink coating film is formed on an FPC board by using such a composition, or when the board on which the coating film was formed is subjected to high heat.

No material has ever been found which has a beautiful appearance and pliability, is superior in photosensitivity and developability, and also satisfies performance requirements such as heat resistance, electrical insulating properties, and adhesion to the circuit board, and which does not cause curling even when used in a thin circuit board such as an FPC board.

DISCLOSURE OF INVENTION

Under these circumstances, the present invention has been made, and an object thereof is to provide a photosensitive composition which can simultaneously satisfy performance requirements with respect to formation of the photosensitive coating film (e.g. photosensitivity, developability, etc.) and performance requirements for the insulating protective coating film (e.g., heat resistance, electrical insulating properties, adhesion to the circuit board, etc.), and which is capable of forming a cured film having pliability, hardness, warp resistance and good appearance.

As a result of earnest research in order to overcome the above-mentioned problems, the present inventors discovered that a photosensitive composition which contains a photocurable component containing a urethane (meth)acrylate compound (A) having a carboxyl group; a thermosetting resin (c); a photopolymerization initiator (D); and a thermopolymerization catalyst (E); wherein the above-mentioned photocurable component further contains at least one of a compound (B) having an ethylenically unsaturated group, excluding the component (A), and an epoxy (meth)acrylate compound (F) having a carboxyl group, is able to simultaneously satisfy the above-mentioned performance requirements, and when used as a coating material for a circuit board such as an FPC board, it forms an insulating protective coating film which has extremely superior characteristics not found in the conventional art, and thereby the present inventors achieved the present invention.

In more detail, the photosensitive composition of the present invention contains a photocurable component containing a urethane (meth)acrylate compound (A) having a carboxyl group; a thermosetting resin (C); a photopolymerization initiator (D); and a thermopolymerization catalyst (E); wherein the above-mentioned photocurable component further contains at least one of a compound (B) having an ethylenically :unsaturated group, excluding the component (A), and an epoxy (meth)acrylate compound (F) having a carboxyl group.

Ink of the present invention comprises the photosensitive composition and a colorant.

The method of curing a photosensitive composition of the present invention comprises applying the photosensitive composition or ink on a board in a thickness of 10 to 100 μm; drying at a temperature ranging from 60 to 100° C. for 5 to 30 minutes, thereby to reduce the thickness to 5 to 70 μm; and heat-curing the photosensitive composition or ink after exposure and development.

The photosensitive dry film of the present invention comprises a support and a photosensitive layer formed from the photosensitive composition on the support.

The method of producing a photosensitive dry film of the present invention comprises the step of applying the photosensitive composition on a support, and drying the photosensitive composition to form a photosensitive layer.

The insulating protective coating film of the present invention comprises the photosensitive composition.

The printed circuit board of the present invention comprises the insulating protective coating film.

The method of producing a printed circuit board of the present invention comprises a laminating step of laminating a photosensitive layer of the photosensitive dry film and a board, an exposure step of exposing the photosensitive layer to light, a developing step which follows the exposure step, and a heat-curing step of heat-curing the photosensitive layer.

BEST MODE FOR CARRYING OUT THE INVENTION

The present invention will now be described in detail.

The photosensitive composition of the present invention contains a photocurable component containing a urethane (meth)acrylate compound (A) having a carboxyl group.

The urethane (meth)acrylate compound (A) having a carboxyl group is a compound containing a unit originating from a (meth)acrylate (a) having a hydroxyl group, a unit originating from a polyol (b) and a unit originating from a polyisocyanate (c) as a constituent unit. In this compound (A), both terminals are composed of the unit originating from the (meth)acrylate (a) having a hydroxyl group, while the moiety between both terminals is composed of the unit originating from a polyol (b) and the unit originating from a polyisocyanate (c). The unit originating from a polyol (b) and the unit originating from a polyisocyanate (c) are bonded through a urethane bond. A repeating unit bonded through this urethane bond has a structure in which a carboxyl group exists.

That is, the repeating unit of the urethane (meth)acrylate compound (A) having a carboxyl group is represented by —(OR$_b$O—OCNHR$_c$NHCO)$_n$— [wherein OR$_b$O represents a dehydration residue of the polyol (b) and R$_c$ represents a deiocyanate residue of the polyisocyanate (c)]. In addition, at least one of R$_b$ and R$_c$ contain a carboxyl group.

The urethane (meth)acrylate compound (A) having a carboxyl group can be prepared by reacting at least a (meth)acrylate (a) having a hydroxyl group, a polyol (b) and a polyisocyanate (c). It is necessary to use a compound having a carboxyl group as the polyol (b) and/or the polyisocyanate. Preferably, a polyol (b) having a carboxyl group is used.

By using a compound having a carboxyl group as the polyol (b) and/or the polyisocyanate (c), it is made possible to prepare a urethane (meth)acrylate compound (A) wherein a carboxyl group exists in R$_b$ or R$_c$.

In the above formula, n is preferably from about 1 to 200, and more preferably from 2 to 30. When n is within such a range, the pliability of the cured film made of the photosensitive composition is more superior.

When using two or more kinds of at least one of the polyol (b) and/or the polyisocyanate (c), the repeating unit represents plural kinds and the regularity of plural units can be appropriately selected according to the purposes such as completely random repetition, block repetition or localized repetition.

Examples of the (meth)acrylate (a) having a hydroxyl group include 2-hydroxyethyl (meth)acrylate, hydroxypropyl (meth)acrylate, hydroxybutyl (meth)acrylate, caprolactone or alkylene oxide adducts of (meth)acrylates described above, glycerin mono(meth)acrylate, glycerin di(meth) acrylate, glycidyl methacrylate-acrylic acid adduct, trimethylolpropane mono(meth)acrylate, trimethylol di(meth) acrylate, pentaerythritol tri(meth)acrylate, dipentaerythritol penta(meth)acrylate, ditrimethylolpropane tri(meth) acrylate, and trimethylolpropane-alkylene oxide adduct-di (meth)acrylate.

These (meth)acrylates (a) having a hydroxyl group can be used alone or in combination of two or more thereof. Among these (meth)acrylates (a) having a hydroxyl group, 2-hydroxyethyl (meth)acrylate, hydroxypropyl (meth) acrylate and hydroxybutyl (meth)acrylate are preferred, and 2-hydroxyethyl (meth)acrylate is more preferred. When using 2-hydroxyethyl (meth)acrylate, the urethane (meth) acrylate compound (A) having a carboxyl group is synthesized more easily.

The polyol (b) is a compound which constitutes a repeating unit of the urethane (meth)acrylate compound (A) having a carboxyl group, along with the polyisocyanate (c).

As the polyol (b), for example, a polymer polyol (b1) and/or a dihydroxyl compound (b2) can be used.

Examples of the polymer polyol (b1) used in the present invention include polyether-based diols such as polyethylene glycol, polypropylene glycol or polytetramethylene glycol; polyester-based polyols obtained from an ester of a polyhydric alcohol and a polybasic acid; polycarbonate-based diols containing an unit originating from hexamethylene carbonate or pentamethylene carbonate as a constituent unit; and polylactone-based diols such as polycaprolactonediol or polybutyrolactonediol.

When using the polymer polyol (b1) having a carboxyl group, it is possible to use a compound synthesized so that a trivalent polybasic acid or a polybasic acid of higher valance such as trimellitic acid (anhydride) is added in the synthesis of the polymer polyol (b1), thus leaving a carboxyl group.

These polymerpolyols (b1) can be used alone or in combination of two or more thereof. When using those having a number-average molecular weight of 200 to 2000 as the polymerpolyl (b1), the pliability of the cured film made of the photosensitive composition is more superior and, therefore, it is preferred. When using polycarbonate-based diols among these polymerpolyols (b1), the cured film made of the photosensitive composition has excellent heat resistance and is also superior in resistance to pressure cooker, and therefore, it is preferred. Furthermore, when the constituent unit of the polymer polyol (b1) is not composed of a single constituent unit, but is composed of plural constituent units, the pliability of the cured film made of the photosensitive composition is more superior and therefore, it is more preferred. Examples of the polymer polyol (b1) composed of plural constituent units include polyether-based diols containing a unit originating from ethylene glycol and propylene glycol; and polycarbonate-based diols containing a unit originating from hexamethylene carbonate and pentamethylene carboante.

As the dihydroxyl compound (b2), a branched or straight-chain compound having two alcoholic hydroxyl groups can be used and an aliphatic dihydroxycarboxylic acid having a carboxyl group is used particularly preferably. Examples of the dihydroxyl compound (b2) include dimethylolpropionic acid and dimethylolbutanoic acid. A carboxyl group can be easily introduced into the urethane (meth)acrylate compound (A) by using the aliphatic dihydroxycarboxylic acid having a carboxyl group.

These dihydroxyl compounds (b2) can be used alone or in combination of two or more thereof, and may be used in combination with the polymer polyol (b1).

When the polymer polyol (b1) having a carboxyl group is used in combination or those having a carboxyl group are used as the polyisocyante (c) described below, a dihydroxyl compound (b2) having no carboxyl group, such as ethylene glycol, diethylene glycol, propylene glycol, 1,4-butanediol, 1,3-butanediol, 1,5-pentanediol, neopentyl glycol, 3-methyl-1,5-pentanediol, 1,6-hexanediol, 1,4-cyclohexanedimethanol or hydroquinone may be used.

Specific examples of the polyisocyanate (c) used in the present invention include diisocyanates such as 2,4-toluene diisocyanate, 2,6-toluene diisocyanate, isophorone diisocyanate, hexamethylene diisocyanate, diphenylmethylene diisocyanate, (o, m, or p)-xylene diisocyanate, methylenebis(cyclohexyl isocyanate), trimethylhexamethylene diisocyanate, cyclohexane-1,3-dimethylene diisocyanate, cyclohexane-1,4-dimethylene diisocyanate, and 1,5-naphthalene diisocyanate. These polyisocyanates can be used alone or in combination of two or more thereof.

A polyisocyanate (c) having a carboxyl group can be used.

The urethane (meth)acrylate compound (A) having a carboxyl group used in the present invention preferably has a number-average molecular weight of 1000 to 40000 and an acid value of 5 to 150 mg KOH/g. The measurement of the acid value was based on JIS K5407. As used herein, the number-average molecular weight is a value in terms of polystyrene as measured by gel permeation chromatography. More preferably, the number-average molecular weight is from 8000 to 30000 and the acid value is from 30 to 120 mg KOH/g.

When the number-average molecular weight of the urethane (meth)acrylate compound (A) having a carboxyl group is less than 1000, the elongation and strength of the cured film made of the photosensitive composition are sometimes impaired. On the other hand, when the number-average molecular weight exceeds 40000, the pliability is likely to be lowered because the cured film becomes too hard. When the acid value is less than 5 mg KOH/g, the alkali solubility of the photosensitive composition may become inferior. On the other hand, when the acid value exceeds 150 mg KOH/g, the alkali resistance and electrical characteristics of the cured film may become inferior.

The acid value of the urethane (meth)acrylate compound (A) having a carboxyl group is, as mentioned above, preferably within the range of 5 to 150 mg KOH/g. However, even within such a range, if the acid value is increased, there is a tendency for the developability to be improved, while the pliability of the cured film is degraded. On the other hand, if the acid value is decreased, there is a tendency for the pliability of the cured film to be improved, while the developability is degraded and developer remnant occurs readily. However, if a combination of at least two urethane (meth)acrylate compounds (A) having carboxyl groups and having different acid values are used, it is possible to easily obtain a photosensitive composition with which it is possible to form a cured film having superior pliability and which has excellent developability. In particular, it is preferable to use at least one of each of a urethane (meth)acrylate compound (A-1) having a carboxyl group having an acid value of 5 mg KOH/g or greater and less than 60 mg KOH/g, and a urethane (meth)acrylate compound (A-2) having a carboxyl group having an acid value of 60 mg KOH/g or greater and 150 mg KOH/g or less. In addition, with regard to the ratio when (A-1) and (A-2) are combined and used, it is preferable for the (A-1) having an acid value of 5 mg KOH/g or greater and less than 60 mg KOH/g to be in excess. Specifically, in 100% by mass of urethane (meth)acrylate compound (A) having a carboxyl group, it is preferable for (A-1) which has an acid value of 5 mg KOH/g or greater and less than 60 mg KOH/g to be 60 to 90% by mass and (A-2) which has an acid value of 60 mg KOH/g or greater and 150 mg KOH/g or less to be 40 to 10% by mass.

The urethane (meth)acrylate compound (A) having a carboxyl group can be prepared by (1) a method of reacting a (meth)acrylate (a) having a hydroxyl group, a polyol (b) and a polyisocyanate (c) by simultaneously mixing them, (2) a method of reacting a polyol (b) with a polyisocyanate (c) to prepare a urethane isocyanate prepolymer having one or more isocyanate groups in a molecule and reacting the urethane isocyanate prepolymer with a (meth)acrylate (a) having a hydroxyl group, or (3) a method of reacting a (meth)acrylate (a) having a hydroxyl group with a polyisocyanate (c) to prepare a urethane isocyanate prepolymer having one or more isocyanate groups in a molecule and reacting the prepolymer with a polyol (b).

The photocurable component of the photosensitive composition also contains, in addition to component (A) described above, at least one of a compound (B) having an ethylenically unsaturated group, excluding urethane (meth)acrylate compound (A) having a carboxyl group, or an epoxy (meth)acrylate compound (F) having a carboxylic group.

The compound (B) having an ethylenically unsaturated group is a compound other than the urethane (meth)acrylate compound (A) having a carboxyl group, and is used to adjust the viscosity of the photosensitive composition or to adjust physical properties such as heat resistance and pliability of the cured article obtained from the photosensitive composition. Preferably, a (meth)acrylic acid ester is used.

Specific examples thereof include alkyl (meth)acrylates such as methyl (meth)acrylate, ethyl (meth)acrylate, propyl (meth)acrylate, butyl (meth)acrylate, isobutyl (meth)acrylate, sec-butyl (meth)acrylate, tert-butyl (meth)acrylate, hexyl (meth)acrylate, octyl (meth)acrylate, isooctyl (meth) acrylate, 2-ethylhexyl (meth)acrylate, decyl (meth)acrylate, lauryl (meth)acrylate, or stearyl (meth)acrylate; alicyclic (meth)acrylates such as cyclohexyl (meth)acrylate, bornyl (meth)acrylate, isobornyl (meth)acrylate, dicyclopentenyl (meth)acrylate, or dicyclopentenyloxyethyl (meth)acrylate; aromatic (meth)acrylates such as benzyl (meth)acrylate, phenyl (meth)acrylate, phenylcarbitol (meth)acrylate, nonylphenyl (meth)acrylate, nonylphenylcarbitol (meth) acrylate, or nonylphenoxy (meth)acrylate; (meth)acrylates having a hydroxyl group, such as 2-hydroxyethyl (meth) acrylate, hydroxypropyl (meth)acrylate, hydroxybutyl (meth)acrylate, butanediol mono(meth)acrylate, glycerol (meth)acrylate, phenoxyhydroxypropyl (meth)acrylate, polyethylene glycol (meth)acrylate, or glycerol di(meth) acrylate; (meth)acrylates having an amino group, such as 2-dimethylaminoethyl (meth)acrylate, 2-diethylaminoethyl (meth)acrylate, or 2-tert-butylaminoethyl (meth)acrylate; methacrylates having a phosphorous atom, such as methacryloxyethyl phosphate, bismethacryloxyethyl phosphate, or methacryloxyethylphenyl acid phosphate(phenyl P); diacrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth) acrylate, 1,4-butanediol di(meth)acrylate, 1,3-butanediol di(meth)acrylate, neopentyl glycol di(meth)acrylate, 1,6-hexanediol di(meth)acrylate, or bisglycidyl (meth)acrylate; polyacrylates such as trimethylolpropane tri(meth)acrylate, pentaerythritol tri(meth)acrylate, or dipentaerythritol hexa (meth)acrylate; modified polyol polyacrylates such as ethylene oxide (4 mol)-modified diacrylate of bisphenol S, ethylene oxide (4 mol)-modified diacrylate of bisphenol A, fatty acid-modified pentaerythritol diacrylate, propylene oxide (3 mol)-modified triacrylate of trimethylolpropane, or propylene oxide (6 mol)-modified triacrylate of trimethylolpropane; polyacrylates having an isocyanuric acid skeleton, such as bis(acryloyloxyethyl)monohydroxyethyl isocyanurate, tris(acryloyloxyethyl) isocyanurate, or ε-caprolactone-modified tris(acryloyloxyethyl) isocyanurate; polyester acrylates such as α, ω-diacryloyl-(bisethylene glycol) phthalate, or α, ω-tetraacryloyl-(bistrimethylolpropane) tetrahydrophthalate; glycidyl (meth)acrylate; allyl (meth)acrylate; ω-hydroxyhexanoyloxyethyl(meth)acrylate; polycaprolactone (meth)acrylate; (meth)acryloyloxyethyl phthalate; (meth)acryloyloxyethyl succinate; 2-hydroxy-3-phenoxypropyl acrylate; and phenoxyethyl acrylate.

N-vinyl compounds such as N-vinyl pyrrolidone, N-vinylformamide, or N-vinylacetamide, and polyester acrylate, urethane acrylate or epoxy acrylate can be preferably used as the compound (B) having an ethylenically unsaturated group.

Among these compounds, (meth)acrylate having a hydroxyl group, glycidyl (meth)acrylate and urethane acrylate, each having a hydroxyl group, are preferred. Examples of the (meth)acrylate having a hydroxyl group include 2-hydroxyethyl (meth)acrylate, hydroxypropyl (meth)acrylate, hydroxybutyl (meth)acrylate. In addition, since the heat resistance of the cured film obtained from the photosensitive composition increases, it is preferable to use as the compound having an ethylenically unsaturated group as (B), one having three or more ethylenically unsaturated groups.

When the photocurable component contains the compound (B) having an ethylenically unsaturated group, excluding the compound (A), a mixing ratio of the urethane (meth)acrylate compound (A) having a carboxyl group to the compound (B) having an ethylenically unsaturated group, excluding the compound (A), is within a range from 95:5 to 50:50, preferably from 90:10 to 60:40, and more preferably from 85:15 to 70:30, in terms of a mass ratio. When the amount of the component (A) exceeds 95% by mass, the soldering heat resistance of the cured film made of the photosensitive composition are sometimes lowered. On the other hand, when the amount of the component (A) is less than 50% by mass, the alkali solubility of the photosensitive composition tends to be lowered.

The epoxy (meth)acrylate compound (F) having a carboxyl group can be obtained by reacting an epoxy compound, a (meth)acrylic acid, and an acid anhydride.

Examples of the epoxy compound to be used include, but are not limited to, bisphenol A type epoxy resin, bisphenol F type epoxy resin, bisphenol S type epoxy resin, phenol novolak type epoxy resin, and cresol novolak type epoxy compound, and aliphatic epoxy compound.

Examples of the acid anhydride include dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylenetetrahydrophthalic anhydride, methylendomethylenetetrahydrophthalic anhydride, chlorendic anhydride, or methyltetrahydrophthalic anhydride; aromatic polyhydric carboxylic anhydrdes such as trimellitic anhydride, pyromellitic anhydride, or benzophenonetetracarboxylic dianhydride; and 5-(2,5-dioxotetrahydrofuryl)-3-methyl-3-cyclohexene-1,2-dicarboxylic anhydride, or endobicyclo-[2,2,1]-hept-5-ene-2,3-dicarboxylic anhydride.

The acid value of the epoxy (meth)acrylate compound (F) having a carboxyl group is preferably 10 mg KOH/g or more, preferably from 45 to 160 mg KOH/g, and more preferably from 50 to 140 mg KOH/g. When using an epoxy (meth)acrylate compound (F) having such an acid value, balance between the alkali solubility of the photosensitive composition and the alkali resistance of the cured film can be improved. When the acid value is less than 10 mg KOH/g, the alkali solubility becomes inferior. On the other hand, when the acid value is too large, characteristics for resist, for example, alkali resistance and electrical characteristics of the cured film are sometimes lowered according to the constituent components of the photosensitive composition.

When using an epoxy (meth)acrylate compound (F) having a carboxyl group, the mixing ratio of the urethane (meth)acrylate compound (A) having a carboxyl group to the epoxy (meth)acrylate compound (F) having a carboxyl group is preferably 9:1 to 1:9 by mass ratio, and more preferably 3:7 to 8:2 by mass ratio. When component (F) is greater than 90% by mass, the hardness and heat resistance of the obtained cured film are degraded, and when the above-mentioned component (A) is 90% by mass or greater warping may be induced due to the thickness of the FPC.

In addition, the photocurable component may contain both of (B) a compound having an ethylenically unsaturated group, excluding (A), and an epoxy (meth)acrylate compound (F) having a carboxylic group.

The thermosetting resin (C) used in the present invention is contained in the photosensitive composition as a thermosetting component, and the thermosetting resin (C) may itself be cured by means of heat or may react with the carboxyl groups in component (A) due to heat.

In more detail, epoxy resin, phenol resin, silicone resin, melamine derivative (for example, hexamethoxymelamine, hexabutoxylated melamine, condensed hexamethoxymelamine, and the like), urea compounds (for example, dimethylolurea, and the like), bisphenol A compounds (for example, tetramethylol bisphenol A, and the like), oxazoline compounds, oxetane compounds, and the like can be mentioned. These thermosetting resins (C) can be used singly or in combinations of two or more. From among these, epoxy resin is preferable.

The epoxy resin include epoxy compounds having two or more epoxy groups in a molecule, such as bisphenol A type epoxy resin, hydrogenated bisphenol A type epoxy resin, brominated bisphenol A type epoxy resin, bisphenol F type epoxy resin, novolak type epoxy resin, phenol novolak type epoxy resin, cresol novolak type epoxy resin, N-glycidyl type epoxy resin, novolak type epoxy resin of bisphenol A, chelete type epoxy resin, glyoxazol type epoxy resin, amino group containing epoxy resin, rubber-modified epoxy resin, dicyclopentadiene phenolic type epoxy resin, silicone-modified epoxy resin, and ε-caprolactone-modified epoxy resin. There can also be used those wherein halogens such as chlorine and bromine and atoms such as phosphorous atom are introduced into a structure in the bonded state where they are less likely to be decomposed by heat or water, for the purpose of imparting flame retardance. Furthermore, bisphenol S type epoxy resin, diglycidyl phthalate resin, heterocyclic epoxy resin, bixylenol type epoxy resin, biphenyl type epoxy resin, and tetraglycidyl xylenoylethane resin can be used. These epoxy resins can be used alone or in combination of two or more thereof.

In addition, it is preferable for the photosensitive composition of the present invention which contains epoxy resin as the thermosetting resin (C) to be a heterogeneous system which contains the phase which comprises this epoxy resin. Specifically, it is in the state where a solid or semisolid epoxy resin is observed in the photosensitive composition before curing, that is, the state where the epoxy resin is mixed non-uniformly with the photosensitive composition. The particle diameter of the epoxy resin is preferably a particle diameter which does not exert an adverse influence on screen printing. For example, the entire photosensitive composition before curing is not uniformly transparent, and at least portion thereof is opaque. The pot life of the photosensitive composition is prolonged when the photosensitive composition before curing is a heterogeneous system containing the phase of the epoxy resin and, therefore, it is preferred.

Preferred epoxy resins is at least one selected from the group consisting of bisphenol S type epoxy resin, diglycidyl phthalate resin, heterocyclic epoxy resin, bixylenol type epoxy resin, biphenyl type epoxy resin, and tetraglycidyl xylenoylethane resin. It is preferred that the photosensitive composition contain the phase of these epoxy resins and the photosensitive composition before curing is a heterogeneous system. As the epoxy resin which enables the photosensitive composition before curing to become a heterogeneous system, a biphenyl type epoxy resin is preferred because it is a crystal having a clear melting point and is capable of easily forming a heterogeneous system, thus yielding a cured article having excellent heat resistance.

In the photosensitive composition of the present invention, the amount of the thermosetting resin (C) as the heat-curing component is preferably within a range from 10 to 150 parts by mass, and more preferably from 10 to 50 parts by mass, based on 100 parts by mass of the total amount of the photocurable component.

When the amount of the thermosettinng resin (C) is less than 10 parts by mass, the soldering heat resistance of the cured film made of the photosensitive composition becomes poor sometimes. On the other hand, when the amount exceeds 150 parts by mass, the shrinkage amount of the cured film increases. When using the cured film in an insulating protective coating film of an FPC board, warping (curling) tends to be increased.

Examples of the photopolymerization initiator (D) used in the present invention include benzophenones such as benzophenone, benzoylbenzoic acid, 4-phenylbenzophenone, hydroxybenzophenone, and 4,4'-bis(diethylamino)benzophenone; benzoin alkyl ethers such as benzoin, benzoin ethyl ether, benzoin isopropyl ether, benzoin butyl ether, and benzoin isobutyl ether; acetophenones such as 4-phenoxydichloroacetophenone, 4-t-butyl-dichloroacetophenone, 4-t-butyl-trichloroacetophenone, diethoxyacetophenone, and 2-benzyl-2-dimethylamino-1-(4-morpholinophenyl)-butanone-1; thioxanthens such as thioxanthen, 2-chlorothioxanthen, 2-methylthioxanthen, and 2,4-dimethylthioxanthen; alkyl anthraquinones such as ethylanthraquinone and butylanthraquinone; acylphosphine oxides such as 2,4,6-trimethylbenzoyldiphenylphosphine oxide; benzyldimethylketals such as 2,2-dimethoxy-1,2-diphenylethan-1-one; α-aminoketones such as 2-methyl-1-[4-(methylthio)phenyl]-2-morpholinopropan-1-one and 2-benzyl-2-dimethylamino-1-(4-morpholinophenyl)-butanone-1; α-hydroxyketones such as 2-hydroxy-2-methyl-1-phenyl-propan-1-one and 1-[4-(2-hydroxyethoxy)phenyl]-2-hydroxy-2-methyl-propane-1-one; and 9,10-phenanthrenequinione. These photopolymerization initiators (D) can be used alone or in combination of two or more thereof. If necessary, photosensitizers can be used in combination.

Among these photopolymerization initiators (D), benzophenones, acetophenones, acylphosphine oxides, α-aminoketones and α-hydroxyketones are preferred, and 4,4'-bis(diethylamino)benzophenone, 2-benzyl-2-dimethylamino-1-(4-morpholinophenyl)-butanone-1,2,4,6-trimethylbenzoyldiphenylphosphine oxide, 2-methyl-1-[4-(methylthio)phenyl]-2-morpholinopropane-1-one and 2-benzyl-2-dimethylamino-1-(4-morpholinophenyl)-butanone-1 and 1-hydroxy-cyclohexyl-phenylketone are particularly preferred because of high wavelength absorption efficiency and high activity.

The amount of these photopolymerization initiators (D) is preferably within a range from 0.1 to 20 parts by mass, and more preferably from 0.2 to 10 parts by mass, based on 100 parts by mass of the photocurable component. When the amount of the photopolymerization initiator (D) is less than 0.1 parts by mass, the photosensitive composition is not sufficiently cured sometimes.

The thermopolymerization catalyst (E) used in the present invention has an action of heat-curing the thermosetting resin (C) and there can be used amines; amine salts such as chlorides of amines; quaternary ammonium salts; acid anhydrides such as cyclic aliphatic acid anhydride, aliphatic acid anhydride, and aromatic acid anhydride; polyamides; imidazoles; nitrogen containing heterocyclic compounds such as triazine compound; and organometallic compounds. These thermopolymerization catalysts (E) can be used alone or in combination of two or more thereof.

Examples of amines include aliphatic and aromatic primary, secondary and ternary amines. Examples of the aliphatic amine include polymethylenediamine, polyetherdiamine, diethylenetriamine, triethylenetriamine, tetraethylenepentamine, triethylenetetramine, dimethylaminopropylamine, menthenediamine, aminoethylethanolamine, bis(hexamethylene)triamine, 1,3,6-trisaminomethylhexane, tributylamine, 1,4-diazabicyclo[2,2,2]octane, and 1,8-diazabicyclo[5,4,0]undecen-7-ene. Examples of the aromatic amine include methaphenylenediamine, diaminodiphenylmethane, diaminodiphenylmethane, and diaminodiphenylsulfone.

Examples of acid anhydrides include aromatic acid anhydrides such as phthalic anhydride, trimellitic anhydride, benzophenonetetracarboxylic anhydride, ethylene glycol bis(anhydrotrimellitate), or glyceroltris(anhydrotrimellitate); maleic ahydride; succinic ahydride; methyl nadic acid anhydride; hexahydrophthalic anhydride; tetrahydrophthalic anhydride; polyadipic acid anhydride; chlorendic ahydride; and tetrabromophthalic anhydride.

Examples of polyamides include polyaminoamide having a primary or secondary amino group obtained by the condensation reaction of a dimer acid and polyamines such as diethylenetriamine or triethylenetetramine.

Specific examples of imidazoles include imidazole, 2-ethyl-4-methylimidazole, N-benzyl-2-methylimidazole, 1-cyanoethyl-2-undecylimidazolium trimellitate, and 2-methylimidazolium isocyanurate.

The triazine compound is a compound having a six-membered ring containing three nitrogen atoms and examples thereof include melamine compound, cyanuric acid compound, and melamine cyanurate compound. Specific examples of the melamine compound include melamine, N-ethylenemelamine, and N,N',N"-triphenylmelamine. Examples of the cyanuric acid compound include cyanuric acid, isocyanuric acid, trimethyl cyanurate, trismethyl isocyanurate, triethyl cyanurate, trisethyl isocyanurate, tri(n-propyl) cyanurate, tris(n-propyl) isocyanurate, diethyl cyanurate, N,N'-diethyl isocyanurate, methyl cyanurate, and methyl isocyanurate. Examples of the melamine cyanurate compound include equimolar reaction product of melamine compound and cyanuric acid compound.

Examples of the organometallic compound include organic acid metal salt, 1,3-diketone metal complex salt, and metal alkoxide. Specific examples thereof include organic acid metal salts such as dibutyltin dilaurate, dibutyltin maleate, or zinc 2-ethylhexanoate; 1,3-diketone metal complex salts such as nickel acetylacetonate or zinc acetylacetonate; and metal alkoxides such as titanium tetrabutoxide, zirconium tetrabutoxide, or aluminum butoxide.

The amount of the thermopolymerization catalyst (E) is within a range from 0.5 to 20 parts by mass, and preferably from 1 to 10 parts by mass, based on 100 parts by mass of the thermosetting resin (C). When the amount of the thermopolymerization catalyst (E) is smaller than 0.5 parts by mass, the curing reaction does not proceed sufficiently, thereby lowering the heat resistance. Since it becomes necessary to cure at high temperature for a long time, the working efficiency is lowered. On the other hand, when the amount is 20 parts by mass or more, it reacts with the carboxyl group in the photosensitive composition and gelation is liable to occur, thereby causing a problem such as lowering of the storage stability.

The photosensitive composition of the present invention can be prepared by mixing the above components using a conventional method. The mixing method is not specifically limited. The rest of components may be mixed after mixing partial components, or all components may be mixed simultaneously.

If necessary, an organic solvent may be added to the photosensitive composition to adjust the viscosity. By adjusting the viscosity, it becomes easy to apply or print the photosensitive composition on a target object by means of a roller coater, a spin coater, a screen coater, or a curtain coater.

Examples of the organic solvent include ketone-based solvents such as ethyl methyl ketone, methyl isobutyl ketone, or cyclohexanone; ester-based solvents such as ethyl acetoacetate, γ-butyrolactone, or butyl acetate; alcohol-based solvents such as butanol or benzyl alcohol; cellosolve-based or carbitol-based solvents such as carbitol acetate or methylcellosolve acetate, and esters or ether derivatives thereof; amide-based solvents such as N,N-dimethylformamide, N,N-dimethylacetamide, N,N-dimethylformamide, or N-methyl-2-pyrrolidone; dimethyl sulfoxide; phenol-based solvents such as phenol or cresol; nitro compound-based solvents; aromatic solvents such as toluene, xylene, hexamethylbenzene, or cumene; and aromatic or alicyclic solvents of hydrocarbon such as tetralin, decalin, or dipentene. These organic solvents can be used alone or in combination of two or more thereof.

The amount of the organic solvent is preferably adjusted so that the viscosity of the photosensitive composition becomes 500 to 500,000 mPa·s [as measured at 25° C. using B-type viscometer(a Brookfield Viscometer)]. More preferably, the viscosity is within a range from 1,000 to 500,000 mPa·s. The photosensitive composition having the viscosity within such a range is suited for application or printing on the target object, and is easily used. In order to adjust to such a viscosity, the amount of the organic solvent is preferably not more than 1.5 times by mass the solid content other than the organic solvent. When the amount is larger than 1.5 times by mass the solid content, the solid content is reduced, and when the photosensitive composition is printed on the board, sufficient thickness of the film cannot be obtained by printing once, and it sometimes becomes necessary to print several times.

The photosensitive composition can also be used as an ink after adding colorants. Examples of the colorant include phthalocyanine blue, phthalocyanine green, iodine green, disazo yellow, crystal violet, titanium oxide, carbon black, and naphthalene black. When used as an ink, the viscosity is preferably within a range from 500 to 500,000 mPa·s[as measured at 25° C. using a B-type viscometer (a Brookfield Viscometer)].

To adjust the fluidity, flow modifiers can be further added to the photosensitive composition of the present invention. The flow modifier is preferred because it is capable of appropriately controlling the fluidity of the photosensitive composition when the photosensitive composition is applied on a target by means of a roller coater, a spin coater, a screen coater, or a curtain coater. Examples of the flow modifier include inorganic and organic fillers, wax, and surfactant.

Specific examples of the inorganic filler include talc, barium sulfate, barium titanate, silica, alumina, clay, magnesium carbonate, calcium carbonate, aluminum hydroxide, and silicate compound. Specific examples of the organic filler include silicone resin, silicone rubber, and fluororesin. Specific examples of the wax include polyamide wax and polyethylene oxide wax. Specific examples of the surfactant include silicone oil, higher fatty acid ester, and amide. These flow modifiers can be used alone or in combination of two or more thereof. Among these flow modifiers, the inorganic filler is preferred because it can improve not only the fluidity of the photosensitive composition, but also characteristics such as adhesion and hardness.

If necessary, additives such as thermopolymerization inhibitors, thickeners, defoamers, leveling agents, and tackifiers can be added to the photosensitive composition.

Examples of the thermopolymerization inhibitor include hydroquinone, hydroquinone monomethyl ether, tert-butyl catechol, pyrogallol, and phenothiazine.

Examples of the thickener include asbestos, orben, bentone, and montmorillonite.

A defoamer is used to eliminate foams produced during the printing, application and curing. Specific examples thereof include acrylic and silicone surfactants.

The leveling agent is used to eliminate the unevenness of the film surface formed during the printing and application. Specific examples thereof include acrylic-based and silicone-based surfactants. Examples of the tackifier include imidazole-based, thiazole-based, triazole-based and silane coupling agents.

Other additives such as ultraviolet absorbers and plasticizers can be added to impart storage stability unless the purpose of the present invention is impaired.

The cured article can be obtained by applying the photosensitive composition of the present invention on a board in a proper thickness and drying the photosensitive composition by a heat treatment, followed by exposure, development and further heat-curing.

The photosensitive composition of the present invention can be used for various purposes. Particularly, the photosensitive composition is suited for use as an insulating protective coating film of a printed circuit board because the photosensitive composition is superior in photosensitivity and developability and a thin film obtained by curing the photosensitive composition is superior in adhesion with the board, insulation properties, heat resistance, warp resistance, pliability, hardness and appearance.

The insulating protective coating film is formed by the method of applying a photosensitive composition or ink on a board, on which a circuit is formed, in a thickness of 10 to 100 $\mu$m, subjecting to a heat treatment at a temperature ranging from 60 to 100° C. for about 5 to 30 minutes, thereby drying the photosensitive composition or ink and forming a coating film having a thickness of 5 to 70 $\mu$m, exposing to light via a negative mask provided with a desired exposure pattern, removing the non-exposed portion with a developer, thereby developing the exposed portion, and heat-curing at a temperature ranging from 100 to 180° C. for about 10 to 40 minutes. This photosensitive composition is particularly suited for use as an insulating protective coating film of an FPC board because the cured article thereof is particularly superior in pliability and flexibility, thus making it possible to form an FPC board which is less likely to cause curling and is superior in handling properties.

For example, it can also be used as an insulating resin layer between layers of a multi-layer printed circuit board.

The activating light used in the exposure may be activating light generated from a known activating light source such as carbon arc, mercury vapor arc, or xenon arc lamps. The photopolymerization initiator (D) contained in the photosensitive layer usually has a maximum sensitivity in the ultraviolet range and in this case, the activating light source is preferably one which effectively emits ultraviolet rays. In the case in which the photopolymerization initiator (D) is sensitive to visible rays, e.g., 9,10-phenanthrenequinione, visible rays are used as activating light. As the light source, for example, photographic electric bulbs and sun lamps can be used, in addition to the activating light source.

As the developer, for example, aqueous alkali solutions of potassium hydroxide, sodium hydroxide, sodium carbonate, potassium carbonate, sodium phosphate, sodium silicate, ammonia, and amines can be used.

The photosensitive composition of the present invention can be used in a photosensitive layer of a photosensitive dry film. The photosensitive dry film comprises a support made of a polymer film and a photosensitive layer made of a photosensitive composition formed on the support. The thickness of the photosensitive layer is preferably from 10 to 70 $\mu$m.

Examples of the polymer film used as the support include films made of a polyester resins such as polyethylene terephthalate or aliphatic polyester, or a polyolefin resins such as polypropylene or low-density polyethylene. Among these polymer films, films made of polyester and low-density polyethylene are preferred, a film made of polyester is more preffered. It is preferred that these polymer films be easily removable from the photosensitive layer because they must be removed from the photosensitive layer later. The thickness of the polymer film is usually from 5 to 100 $\mu$m, and preferably from 10 to 30 $\mu$m.

The photosensitive dry film can be produced by the method having the step of applying a photosensitive composition on a support and drying the photosensitive composition to form a photosensitive layer. By forming a cover film on the photosensitive layer formed, the support, the photosensitive layer and the cover film are laminated in order, thus making it possible to produce a photosensitive dry film having a film on both surfaces of the photosensitive layer. Although the cover film is peeled off immediately before use of the photosensitive dry film, the photosensitive layer can be protected by forming the cover film on the photosensitive layer before use, thus obtaining a photosensitive dry film having excellent pot life. As the cover film, the same polymer film as that used in the support described above can be used. The cover film and the support may be made of the same or different material, and the thickness may be the same or different.

To form an insulating protective coating film on a printed circuit board by using the photosensitive dry film, a laminating step of laminating a photosensitive layer of the photosensitive film and a board is carried out, first. When using the photosensitive dry film provided with a cover film, the photosensitive layer is brought into contact with the board after the cover film is peeled off to expose the photosensitive layer. Then, the photosensitive layer and the board are thermo compression bonded at about 40 to 120° C. using a pressure roller and the like, thereby laminating the photosensitive layer on the board.

Then, an exposure step of exposing the photosensitive layer to light via a negative mask provided with a desired exposure pattern, a step of peeling off the support from the photosensitive layer, a developing step of removing the non-exposed portion with a developer, thereby developing the exposed portion, and a heat-curing step of heat-curing the photosensitive layer are carried out, thereby making it possible to produce a printed circuit board comprising a board and an insulating protective coating film formed on the surface of the board.

An insulating resin layer may be formed between layers of a multi-layer printed circuit board by using such a photosensitive dry film.

As the activating light used in the exposure and developer, the same active light and developer as those described above can be used.

When using such a photosensitive composition, it is made possible to form a cured film which has a beautiful appearance, pliability, warp resistance and hardness, and is superior in photosensitivity and developability, and also satisfies performance requirements such as heat resistance, electrical insulating properties, and adhesion to the circuit board. This cured film is particularly superior in pliability, electrical insulating properties and appearance. Therefore, the photosensitive composition does not cause curing even when used in a thin circuit board such as an FPC board and is capable of forming an insulating protective coating film having excellent electrical performance and handling properties as well as good pliability.

EXAMPLES

The following Examples further illustrate the present invention in detail.

In the following Preparation Examples 1 to 7, the following <PUA-1 to PUA-6> were synthesized as the urethane (meth)acrylate compound (A) having a carboxyl group, and in Examples 8 to 9, the following <EA-1 to EA-2> were synthesized as the epoxy (meth)acrylate compound component (F) having a carboxyl group.

[Preparation Example 1] <PUA-1>

In a reaction vessel equipped with a stirrer, a thermometer and a condenser, 3750 g (3 mol) of polycaprolactonediol (PLACCEL212, manufactured by DAICEL CHEMICAL INDUSTRIES, LTD.) having a molecular weight of 1250 as the polymer polyol, 402 g (3 mol) of dimethylolpropionic acid as the dihydroxyl compound having a carboxyl group, 1554 g (7 mol) of isophorone diisocyanate as the polyisocyanate, 238 g (2.05 mol) of 2-hydroxyethyl acrylate as the (meth)acrylate, and p-methoxyphenol and di-t-butyl-hydroxytoluene (1.0 g each) were charged. The mixture was heated to 60° C. while stirring, and after heating was stopped, 1.6 g of dibutyltin dilaurate was added. When the temperature in the reaction vessel began to decrease, the mixture was heated again and was continuously stirred at 80° C. After confirming by an infrared absorption spectrum that an absorption spectrum (2280 cm$^{-1}$) of an isocyanate group disappeared, the reaction was stopped to obtain a urethane acrylate compound as a viscous liquid.

The resulting urethane acrylate had an average molecular weight of 25,000 and an acid value of 40 mg KOH/g.

[Preparation Example 2] <PUA-2>

In the same manner as in Preparation Example 1 <PUA-1>, except that 2490 g (3 mol) of polycaprolactonediol (PLACCEL208, manufactured by DAICEL CHEMICAL INDUSTRIES, LTD.) having a molecular weight of 830 as the polymer polyol, 402 g (3 mol) of dimethylolpropionic acid as the dihydroxyl compound having a carboxyl group, 1554 g (7 mol) of isophorone diisocyanate as the polyisocyanate and 238 g (2.05 mol) of 2-hydroxyethyl acrylate as the (meth)acrylate having a hydroxyl group were respectively used, a urethane acrylate was synthesized.

The resulting urethane acrylate had an average molecular weight of 22,000 and an acid value of 47 mg KOH/g.

[Preparation Example 3] <PUA-3>

850 g (1 mol) of polytetramethylene glycol (PTG-850SN, manufactured by Hodogaya Chemical CO., Ltd.) having a molecular weight of 850 as the polymer polyol, 938 g (7 mol) of dimethylolpropionic acid as the dihydroxyl compound having a carboxyl group and 1998 g (9 mol) of isophorone diisocyanate as the polyisocyanate were charged. The mixture was heated to 60° C. while stirring, and after heating was stopped, 1.4 g of dibutyltin dilaurate was added. When the temperature in the reaction vessel begins to decrease, the mixture was heated again to 80° C. and continuously stirred while maintaining at 75 to 80° C. The reaction was stopped when the concentration of the residual NCO reached a theoretical value, thereby synthesizing a urethane oligomer. After introducing p-methoxyphenol and di-t-butyl-hydroxytoluene (0.9 g each) into the reaction vessel, 238 g (2.05 mol) of 2-hydroxyethyl acrylate as the (meth)acrylate having a carboxyl group was added and the reaction was started again. After confirming by an absorption spectrum that an absorption spectrum (2280 cm$^{-1}$) of an isocyanate group disappeared, the reaction was stopped to obtain a urethane acrylate compound as a viscous liquid.

The resulting urethane acrylate had an average molecular weight of 16,000 and an acid value of 90 mg KOH/g.

[Preparation Example 4] <PUA-4>

In a flask, 148 g (1.0 mol) of dimethylolbutanoic acid and 352 g (3.09 mol) of ε-caprolactone were charged and 5 ppm of stannous chloride as the catalyst was further charged. In a nitrogen atmosphere, the reaction was carried out at 120° C. and the reaction was stopped when the amount of the residual ε-caprolactone reached 0.5% or less, thereby yielding a polymer polyol. The resulting polymer polyol had an average molecular weight of 500 and an acid value of 110 mg KOH/g.

In the same manner as in Preparation Example 1 <PUA-1>, except that 500 g (1.0 mol) of the above polymer polyol as the polymer polyol, 444 g (2.0 mol) of isophorone diisocyanate as the polyisocyanate, 232 g (2.0 mol) of 2-hydroxyethyl acrylate as the (meth)acrylate having a hydroxyl group and 200 ppm of dibutyltin laurate were respectively used, a urethane acrylate was synthesized. The resulting urethane acrylate had an average molecular weight of 1,200 and an acid value of 47 mg KOH/g.

[Preparation Example 5] <PUA-5>

In the same manner as in Preparation Example 1 <PUA-1>, except that 2550 g (3 mol) of polytetramethylene glycol (PTMG-850, manufactured by Hodogaya Chemical CO., Ltd.) having a molecular weight of 850 as the polymer polyol, 670 g (5 mol) of dimethylolpropionic acid as the dihydroxyl compound having a carboxyl group, 1776 g (8 mol) of isophorone diisocyanate as the polyisocyanate and 238 g (2.05 mol) of 2-hydroxyethyl acrylate as the (meth) acrylate having a hydroxyl group were respectively used, a urethane acrylate was synthesized. The resulting urethane acrylate had an average molecular weight of 22,000 and an acid value of 46 mg KOH/g.

[Preparation Example 6] <PUA-6>

In the same manner as in Preparation Example 1 <PUA-1>, except that 800 g (1 mol) of polycarbonatediol having a molecular weight of 800 containing a unit originating from hexamethylene carbonate and a unit originating from pentamethylene carbonate in a ratio of 1:1 as the polymer polyol, 938 g (7 mol) of dimethylolpropionic acid as the dihydroxyl compound having a carboxyl group, 1998 g (9 mol) of isophorone diisocyanate as the polyisocyanate and 238 g (2.05 mol) of 2-hydroxyethyl acrylate as the (meth) acrylate having a hydroxyl group were respectively used, a urethane acrylate was synthesized. The resulting urethane acrylate had an average molecular weight of 16,000 and an acid value of 90 mg KOH/g.

[Preparation Example 7] <EA-1>

A reactant obtained by reacting 1 equivalent of a cresol novolak-type epoxy resin having an epoxy equivalent of 217 and containing 7 phenol nucleus residues on average within one molecule and also containing an epoxy group, with 1.05 equivalent of acrylic acid was reacted with 0.67 equivalent of tetrahydrophthalic acid anhydride using phenoxyethyl acrylate as the solvent according to an ordinary method. This compound was a viscous liquid containing 35 parts by mass of phenoxyethyl acrylate and as a mixture, exhibited an acid value of 63.4 mg KOH/g.

cresol novolak type epoxy resin EPICON N660 (manufactured by DAINIPPON INK & CHEMICALS Inc.) were used.

As the photopolymerization initiator (D), 2,4,6-trimethylbenzoyldiphenylphosphine oxide TPO (manufactured by BASF Co. "Lueirin TPO"), 4,4'-bis (diethylamino)benzophenone EAB-F (manufactured by Hodogaya Chemical CO., Ltd.) and aminoacetophenone-based Irgacure 184 (manufactured by Ciba Speciality Chemicals K.K.) were used.

As the thermopolymerization catalyst (E), Melamine PC-1 (manufactured by NISSAN CHEMICAL INDUSTRIES, LTD.) was used.

TABLE 1

| Solid content | (A) | | | | | | (B) | | (C) | | | (D) | | (E) |
|---|---|---|---|---|---|---|---|---|---|---|---|---|---|---|
| | PUA-1 (g) | PUA-2 (g) | PUA-3 (g) | PUA-4 (g) | PUA-5 (g) | PUA-6 (g) | UF 8001 (g) | EB 1290K (g) | EPICON 860 (g) | EPICON N660 (g) | YL6121H (g) | TPO (g) | EAB-F (g) | PC-1 (g) |
| Example 1 | 65 | — | — | — | — | — | 12 | 10 | 25 | — | — | 2.2 | 2.2 | 2.5 |
| Example 2 | — | 65 | — | — | — | — | 12 | 10 | 25 | — | — | 2.2 | 2.2 | 2.5 |
| Example 3 | 50 | — | 15 | — | — | — | 12 | 10 | 25 | — | — | 2.2 | 2.2 | 2.5 |
| Example 4 | — | 50 | 15 | — | — | — | 12 | 10 | 25 | — | — | 2.2 | 2.2 | 2.5 |
| Example 5 | 50 | — | — | 15 | — | — | 12 | 10 | 25 | — | — | 2.2 | 2.2 | 2.5 |
| Example 6 | 50 | — | 15 | — | — | — | 12 | 10 | — | 25 | — | 2.2 | 2.2 | 2.5 |
| Example 7 | — | — | — | — | 50 | 15 | 12 | 10 | — | — | 25 | 2.2 | 2.2 | 2.5 |
| Comp. Example 1 | 90 | — | — | — | — | — | 12 | 10 | — | — | — | 2.2 | 2.2 | 2.5 |
| Comp. Example 2 | 87 | — | — | — | — | — | — | — | 25 | — | — | 2.2 | 2.2 | 2.5 |

[Preparation Example 8] <EA-2>

A reactant obtained by reacting 1 equivalent of a phenol novolak-type epoxy resin having an epoxy equivalent of 178 and containing 3.6 phenol nucleus residues on average within one molecule and also containing an epoxy group, with 0.95 equivalent of acrylic acid was reacted with 0.78 equivalent of hexahydrophthalic acid anhydride using diethylene glycol acrylate as the solvent according to an ordinary method. This compound was a viscous liquid containing 35 parts by mass of diethylene glycol acrylate and as a mixture, exhibited an acid value of 72.8 mg KOH/g.

Examples 1 to 7 and Comparative Examples 1 to 2

According to the mixing ratio (parts by mass) shown in Table 1, each of <PUA-1 to PUA-6> prepared in Preparation Examples 1 to 6 as the urethane (meth)acrylate compound (A) having a carboxyl group, the compound (B) having an ethylenically unsaturated group, the thermosetting resin (C), the photopolymerization initiator (D) and the thermopolymerization catalyst (E) were mixed to prepare a photosensitive composition.

As the compound (B) having an ethylenically unsaturated group, urethane acrylate EB1290K (manufactured by DAICEL CHEMICAL INDUSTRIES, LTD.) and UF8001 (manufactured by KYOEISHA CHEMICAL CO., LTD.) were used.

As the thermosetting resin (C), a bisphenol A type epoxy resin EPICON 860 (manufactured by DAINIPPON INK & CHEMICALS Inc.), a biphenyl type epoxy resin YL6121H (manufactured by JAPAN EPOXY RESIN, LTD.) and a Test Example 1

Production of Laminate Test Piece

A Composition having a viscosity of 20,000 mPa·s prepared by adding carbitol acetate to each of the photosensitive compositions prepared in Examples 1 to 7 and Comparative Examples 1 to 2 was applied on a board for evaluation by means of screen printing, using a 150 mesh polyester plate, so that the resulting photosensitive layer had a thickness of about 30 $\mu$m. The photosensitive composition applied on the board was dried at 70 for 30 minutes to produce laminate test piece. The final thickness of the photosensitive layer was 30±2 $\mu$m.

As the board for evaluation, the following boards (1) and (2) were used.

(1) board obtained by washing a printed board [UPISEL®, SR1120 manufactured by UBE INDUSTRIES, LTD.], which is made of a polyimide film (50 $\mu$m in thickness) clad with a copper foil (35 $\mu$m in thickness) on one surface, with an aqueous 1% sulfuric acid solution, washing with water and drying.

(2) 25 $\mu$m thick polyimide film [KAPTON®, manufactured by DU PONT-TORAY CO., LTD.]

[Exposure, Development and Heat-Curing of Laminate Test Piece]

Each laminate test piece thus obtained was exposed by exposing machine HMW-680GW [manufactured by OAK CO., LTD.] having a metal halide lamp at 500 mJ/cm$^2$. Subsequently, an aqueous solution containing 1% by mass of sodium carbonate was sprayed thereon at 30° C. for 60 seconds to remove unexposed portion, and after the development, the heating treatment was carried out at 150° C. for 30 minutes to obtain a copper-clad laminate (using the board (1) for evaluation) and a polyimide laminate (using the board (2) for evaluation).

In the production of the sample for evaluation of the photosensitivity, developability 1 and developability 2, exposure was carried out using a Stofer 21-stage step tablet as a negative pattern.

For evaluation of the soldering heat resistance, the sample, comprising of the board (1) for evaluation of 4 cm×6 cm and a cured film made of a photosensitive layer formed on the whole board (1) for evaluation, was used. Here the copper foil of the board (1) for evaluation was formed in the form of four squares of 1 cm×1 cm and lines/spaces of 2 cm in length and 1 mm/1 mm.

With respect to the electrical insulating properties out of PCT resistances, IPC-C of IPC standard (Institute for Interconnecting and Packaging Electronic Circuit) was used. In the production of other samples for evaluation, the negative pattern was not used.

Physical properties were evaluated in the following procedure. The results are shown in Table 2.

In the following evaluations, the "flexibility" and "warp" were evaluated by using the polyimide laminate. In the evaluation of the electrical insulating properties out of PCT resistances, samples obtained by forming a layer (thickness of layer: 30 μm) made of each of the photosensitive compositions of Examples 1 to 7 and Comparative Examples 1 to 2 on a commercially available board were used. Other evaluations were carried out by using the copper-clad laminate.

[Evaluation Items]
Photosensitivity

The photosensitivity of the photosensitive composition was evaluated by measuring the number of steps of the step tablet of the resulting photocured film formed on the copper-clad laminate. The photosensitivity is expressed by the number of the step tablet. The larger the number of steps of the step tablet, the higher the photoconductivity.

Developability 1

In the evaluation of the photosensitivity, the state of the coating film after developing under the conditions of a temperature of 30° C. and a spray pressure of 2 kg/cm using an aqueous 1% by mass sodium carbonate solution as a developer was visually observed. Symbols in Table 2 are as follows.

○ Completely developed

Δ Development residues slightly remain

X Development residues remain

Developability 2

In the evaluation of the photosensitivity, the state of the coating film after developing under the conditions of a temperature of 30° C. and a spray pressure of 2 kg/cm² using an aqueous 0.5% by mass sodium carbonate solution as a developer was visually observed. Symbols in Table 2 are as follows.

○ Completely developed

Δ Development residues slightly remain

X Development residues remain

Adhesion

In accordance with JIS D-0202, a copper-clad laminate was coat was crosscut to form a pattern of squares and was subjected to a peeling test using a Cellophane tape. Then, the state of peeling after the peeling test was visually evaluated.

⊚ No change is observed (100/100)

○ Slight cracks are observed at the edge of line (100/100)

Δ From 50/100 to 90/100

X From 0/100 to 50/100

Flexibility

The polyimide laminate was bent by 180° in the state where a cured film made of a photosensitive layer faces inside, and the presence or absence of whitening of the cured film was examined.

○ No whitening of cured film occurred

X Whitening of cured film occurred

Warp

Using a polyimide laminate (30 mm×30 mm) as the test piece, one apex on the plane of the test piece was pressed and the distance between an apex positioned diagonally to the apex and the plane was measured. Then, the maximum value was measured as a warp amount. In the case where the warp was excessively large and the warp amount could not be measured, the symbol "x" was used in Table 2.

Soldering Heat Resistance

By taking the operation of floating each copper-clad laminate in a soldering bath at 260° C. for 10 seconds according to JIS C-6481 as one cycle, the cured film after the solder floating in 1 cycle or 3 cycles was synthetically examined and evaluated on the "swelling" and adhesion.

⊚ Completely no change was observed.

○ Very slightly changed.

Δ Less than 10% of the cured film was peeled.

x The cured film was entirely peeled.

PCT Resistance (Resistance to Pressure Cooker)

A copper-clad laminate was allowed to stand in a container maintained at 121° C. and a relative humidity of 100% under 2 atoms (Haft HAST TPC-412-MD, manufactured by TABAI CORP.) for 100 hours, and then a change in appearance, a change in copper foil, and an insulation resistance test were evaluated.

(1) Change in Appearance

Symbols in Table 2 are as follows.

○ Neither lifting, peeling nor surface whitening is not observed in cured film of photosensitive layer Δ Lifting, peeling, and surface whitening are partially observed in cured film of photosensitive layer X Lifting, peeling, and surface whitening are observed in the entire surface of cured film of photosensitive layer (2) Change in Copper Foil Symbols in Table 2 are as follows.

○ No discoloration was observed in copper foil portion

X Some discoloration was observed in copper foil portion (3) Electrical Insulating Properties A layer of each of the photosensitive compositions of Examples 1 to 7 and Comparative Examples 1 to 2 was formed on IPC-C (comb-shaped pattern) of a commercially available board (IPC standard), and after maintaining for one minute while applying a DC 100 V in accordance with JIS C5012, the insulation resistance was measured by an insulation resistance tester in the state where the voltage is applied.

Test Example 2

Production of Laminate Test Piece

A composition having a viscosity of 5,000 mPa·s prepared by adding methylcellosolve to each of the photosensitive compositions prepared in Examples 3, 4, 7 and Comparative Example 2 was applied on a 23 μm thick polyethylene terephthalate film by using a doctor blade and was dried at 80° C. for five minutes to form a photosensitive layer, and then a 30 μm thick polyethylene film was laminated thereon to obtain a photosensitive dry film having a cover film. After drying, the thickness of the photosensitive layer was 30±1 μm.

The cover film of this photosensitive dry film was peeled off and the photosensitive layer was heated to 70° C., while the same board for evaluation as that used in Test Example 1 was heated to 60° C., and then the photosensitive layer and the board for evaluation were bonded by means of a laminator equipped with a pressure roller.

The resulting laminate test pieces were also evaluated in the same manner as in Test Example 1. The results are shown in Table 2.

Examples 8 to 16 and Comparative Examples 3 to 5

Photosensitive compositions were prepared by mixing <PUA-1 and 6> prepared in the above-mentioned Preparation Examples 1 and 6 as urethane (meth)acrylate compound (A) having a carboxyl group, <EA-1 to 2> prepared in Preparation Examples 7 and 8 as epoxy (meth)acrylate compound (F) having a carboxyl group, photocurable resin (C), photopolymerization initiator (D), and thermopolymerization catalyst (E) in the mixing ratios (parts by mass) shown in Table 3. The symbols used in Table 3 are the same as those used in Table 1. The each amount of (A) and (F) shown in Table 3 was solid content.

Test Example 3

Production of Laminate Test Piece

The photosensitive composition prepared in Examples 8 to 13 and Comparative Examples 3 to 4 was respectively applied on a board for evaluation by means of screen printing, using a 150 mesh polyester plate, so that the resulting dried photosensitive layer had a thickness of about 30 μm. The photosensitive composition applied on the board

TABLE 2

| | Photo-Sensitivity | Developability 1 | Developability 2 | Adhesion | Flexibility | Soldering Heat Resistance 1 cycle | Warp Amount (mm) | PCT Change In Appearance | PCT Change in Copper Foil | Insulation resistance before test (Ω) | Insulation resistance after 100 hours (Ω) |
|---|---|---|---|---|---|---|---|---|---|---|---|
| Test Example 1 | | | | | | | | | | | |
| Example 1 | 9 | ○ | Δ | ◎ | ○ | ○ | 1.4 | ○ | ○ | $4.3 \times 10^{14}$ | $2.1 \times 10^{12}$ |
| Example 2 | 9 | ○ | Δ | ◎ | ○ | ○ | 1.4 | ○ | ○ | $3.6 \times 10^{14}$ | $7.0 \times 10^{12}$ |
| Example 3 | 8 | ○ | ○ | ◎ | ○ | ◎ | 1.8 | ○ | ○ | $3.2 \times 10^{14}$ | $1.8 \times 10^{12}$ |
| Example 4 | 8 | ○ | ○ | ◎ | ○ | ◎ | 1.5 | ○ | ○ | $1.5 \times 10^{14}$ | $3.6 \times 10^{12}$ |
| Example 5 | 8 | ○ | Δ | ◎ | ○ | ○ | 1.5 | ○ | ○ | $8.0 \times 10^{13}$ | $4.7 \times 10^{12}$ |
| Example 6 | 8 | ○ | ○ | ◎ | ○ | ○ | 1.6 | ○ | ○ | $1.8 \times 10^{14}$ | $4.9 \times 10^{12}$ |
| Example 7 | 9 | ○ | ○ | ◎ | ○ | ◎ | 1.5 | ○ | ○ | $3.0 \times 10^{14}$ | $9.5 \times 10^{12}$ |
| Comp. Example 1 | 8 | ○ | Δ | Δ | ○ | Δ | 1.2 | X | ○ | $2.2 \times 10^{12}$ | $5.4 \times 10^{7}$ |
| Comp. Example 2 | 4 | ○ | Δ | X | ○ | ○ | 2.6 | Δ | ○ | $3.0 \times 10^{13}$ | $3.5 \times 10^{9}$ |
| Test Example 2 | | | | | | | | | | | |
| Example 3 | 8 | ○ | ○ | ◎ | ○ | ◎ | 1.3 | ○ | ○ | $7.2 \times 10^{13}$ | $1.6 \times 10^{12}$ |
| Example 4 | 8 | ○ | ○ | ◎ | ○ | ◎ | 1.2 | ○ | ○ | $1.0 \times 10^{14}$ | $2.0 \times 10^{12}$ |
| Example 7 | 9 | ○ | ○ | ◎ | ○ | ◎ | 1.2 | ○ | ○ | $4.2 \times 10^{14}$ | $6.8 \times 10^{12}$ |
| Comp. Example 2 | 4 | Δ | Δ | X | ○ | ○ | 2.5 | Δ | ○ | $8.7 \times 10^{12}$ | $1.6 \times 10^{9}$ | was dried at 70° C. for 30 minutes to produce a laminate test piece. The final thickness of the photosensitive -layer was 30±2 μm.

The same board for evaluation as that used in Test Example 1 was used. In the same way as in the above-mentioned Test Example 1, the laminate test pieces were evaluated. The results are shown in Table 4.

In addition, the pencil hardness was measured using the following method.

Pencil Hardness

A load of 1 kg was applied using a pencil hardness tester according to the test method of JIS K-5400 and the pencil hardness was indicated by the highest hardness where the cured film of the cured specimen was not scratched. The pencil used was Mitsubishi Hi-Uni (manufactured by Mitsubishi Pencil K.K.).

Test Example 4

Production of Laminate Test Piece

The photosensitive composition prepared in Examples 14 to 16 and Comparative Example 5 was applied on a 23 μm thick polyethylene terephthalate film by using a doctor blade and was dried at 80° C. for 20 minutes to form a photosensitive layer, and then a 30 μm thick polyethylene film was laminated thereon to obtain a photosensitive dry film having a cover film. After drying, the thickness of the photosensitive layer was 30±1 μm.

The cover film of this photosensitive dry film was peeled off and the photosensitive layer was heated to 70° C., while the same board for evaluation as that used in Test Example 1 was heated to 60° C., and then the photosensitive layer and the board for evaluation were bonded by means of a laminator equipped with a pressure roller. The resulting laminate test pieces were also evaluated in the same manner as in Test Example 1. The results are shown in Table 4.

TABLE 3

| | (F) | | (A) | | (C) | | | (D) | | | (E) | (B) |
|---|---|---|---|---|---|---|---|---|---|---|---|---|
| | EA-1 | EA-2 | PUA-1 | PUA-6 | EPICON 860 | EPICON N660 | YL6121H | TPO | EAB-F | Irgacure 184 | PC-1 | EB1290K |
| Example 8 | 60 | — | 30 | — | 30 | — | — | 2.2 | 2.2 | — | 2.5 | — |
| Example 9 | 40 | — | 50 | — | 30 | — | — | 2.2 | 2.2 | — | 2.5 | — |
| Example 10 | — | 60 | 30 | — | 30 | — | — | 2.2 | 2.2 | — | 2.5 | — |
| Example 11 | 60 | — | 30 | — | 30 | — | — | 2.2 | 2.2 | — | 2.5 | 10 |
| Example 12 | 60 | — | 30 | — | — | 30 | — | 2.2 | 2.2 | — | 2.5 | — |
| Example 13 | 60 | — | 30 | — | 30 | — | — | 2.2 | — | 2.2 | 2.5 | — |
| Example 14 | 60 | — | 30 | — | 30 | — | — | 2.2 | 2.2 | — | 2.5 | — |
| Example 15 | — | 60 | 30 | — | 30 | — | — | 2.2 | — | — | 2.5 | — |
| Example 16 | — | 40 | 25 | 25 | — | — | 30 | 2.2 | 2.2 | — | 2.5 | 10 |
| Comparative Example 3 | 90 | — | — | — | 30 | — | — | 2.2 | 2.2 | — | 2.5 | — |
| Comparative Example 4 | — | — | 90 | — | 30 | — | — | 2.2 | 2.2 | — | 2.5 | — |
| Comparative Example 5 | 90 | — | — | — | 30 | — | — | 2.2 | 2.2 | — | 2.5 | — |

TABLE 4

| | Photo-Sensitivity | Developability 1 | Adhesion | Pencil Hard-ness | Soldering Heat Resistance | | Warp amount (mm) |
|---|---|---|---|---|---|---|---|
| | | | | | 1 Cycle | 3 Cycle | |
| Example 8 | 8 | ○ | ⊚ | 3H | ⊚ | ○ | 2.9 |
| Example 9 | 9 | ○ | ⊚ | 2H | ○ | X | 2.2 |
| Example 10 | 8 | Δ | ⊚ | 4H | ⊚ | Δ | 3.5 |
| Example 11 | 9 | ○ | ⊚ | 2H | ⊚ | Δ | 3.6 |
| Example 12 | 8 | ○ | ⊚ | 3H | ○ | Δ | 3.9 |
| Example 13 | 7.5 | ○ | ⊚ | 3H | ⊚ | Δ | 3.3 |
| Example 14 | 9 | ○ | ⊚ | 4H | ⊚ | ○ | 2.4 |
| Example 15 | 8 | ○ | ⊚ | 3H | ⊚ | Δ | 3 |
| Example 16 | 12 | ○ | ⊚ | 2H | ⊚ | Δ | 1.6 |
| Comparative Example 3 | 7 | X | ⊚ | 5H | ⊚ | ○ | X |
| Comparative Example 4 | 6 | ○ | ○ | HB | X | X | 1.6 |
| Comparative Example 5 | 6 | X | Δ | 5H | ⊚ | ○ | X |

INDUSTRIAL APPLICABILITY

As described above, the photosensitive composition of the present invention can simultaneously satisfy performance requirements with respect to formation of the photosensitive coating film (e.g. photosensitivity, developability, etc.) and performance requirements for the insulating protective coating film (e.g., heat resistance, electrical insulating properties, adhesion to the circuit board, etc.), and which is capable of forming a cured film having pliability, hardness, warp resistance and good appearance. Therefore, the photosensitive composition is suitable for use as an insulating protective coating film for printed circuit boards. Since the cured film made of the photosensitive composition of the present invention is particularly superior in pliability, curling does not occur even when used for a thin circuit board. Therefore, the cured film is best suited for use in an FPC board.

What is claimed is:

1. A photosensitive composition comprising:
    a photocurable component containing a urethane (meth)acrylate compound (A) having a carboxyl group, wherein compound (A) comprises a urethane (meth)acrylate compound (A-1) having a carboxyl group which has an acid value of 5 mg KOH/g or greater and less than 60 mg KOH/g, and a urethane (meth)acrylate compound (A-2) having a carboxyl group which has an acid value of 60 mg KOH/g or greater and 150 mg KOH/g or less;
    a thermosetting resin (C);
    a photopolymerization initiator (D): and
    a thermopolymerization catalyst (E);
    wherein said photocurable component contains at least one of a compound (B) having an ethylenically unsaturated group, excluding (A), and an epoxy (meth)acrylate compound (F) having a carboxyl group.

2. A photosensitive composition according to claim 1, wherein the urethane (meth)acrylate compound (A) having a carboxyl group contains a unit originating from a (meth)acrylate (a) having a hydroxyl group, a unit originating from a polyol (b) and a unit originating from a polyisocyanate (C) as a constituent unit.

3. A photosensitive composition according to claim 2, wherein the polyol (b) is a polymer polyol (b1) and/or a dihydroxyl compound (b2), and the polymer polyol (b1) and/or the dihydroxyl compound (b2) have a carboxyl group.

4. A photosensitive composition according to claim 3, wherein the number-average molecular weight of the polymer polyol (b1) is from 200 to 2000.

5. A photosensitive composition according to claim 3, wherein the polymer polyol (b1) is polycarbonate-based diol.

6. A photosensitive composition according to claim 3, wherein the dihydroxyl compound (b2) is dimethyloipropionic acid and/or dimethylolbutanoic acid.

7. A photosensitive composition according to claim 1, wherein the compound (B) having an ethylenically unsaturated group is (meth)acrylate having a hydroxyl group and/or glycidyl (meth)acrylate.

8. A photosensitive composition according to claim 1, wherein the epoxy (meth)acrylate compound (F) having a carboxyl group has an acid value of 10 mg KOH/g or greater.

9. A photosensitive composition according to claim 1, wherein the thermosetting resin (C) is an epoxy resin.

10. A photosensitive composition according to claim 9, which is a heterogeneous system containing a phase of an epoxy resin, the epoxy resin being at least one selected from the group consisting of bisphenol S type epoxy resin, diglycidyl phthalate resin, heterocyclic epoxy resin, bixylenol type epoxy resin, biphenyl type epoxy resin and tetraglycidyl xylenoylethane resin.

11. A photosensitive composition according to claim 10, wherein the epoxy resin is a biphenyl type epoxy resin.

12. A photosensitive composition according to claim 1, wherein the photopolymerization initiator (D) is compounded in the amount of 0.1 to 20 parts by mass based on 100 parts by mass of the photocurable component.

13. A photosensitive composition according to claim 1, wherein the thermopolymerization catalyst (E) is at least one selected from the group consisting of amine, quaternary ammonium salt, acid anhydride, polyamide, nitrogen containing heterocyclic compound and organometallic compound.

14. A photosensitive composition according to claim 1, comprising an organic solvent.

15. Ink comprising the photosensitive composition of claim 14, and a colorant.

16. Ink according to claim 15, wherein the viscosity is from 500 to 500,000 mPa·s.

17. A method of curing a photosensitive composition, which comprises applying the photosensitive composition of claim 15 on a board in a thickness of 10 to 100 μm; drying at a temperature ranging from 60 to 100° C. for 5 to 30 minutes, thereby reducing the thickness to 5 to 70 μm; and heat-curing the photosensitive composition after exposure and development.

18. A photosensitive composition according to claim 1, wherein the viscosity is from 500 to 500,000 mPa·s.

19. A cured article obtained by curing the photosensitive composition of claim 1.

20. A method of curing a photosensitive composition, which comprises applying the photosensitive composition of claim 1 on a board in a thickness of 10 to 100 μm; drying at a temperature ranging from 60 to 100° C. for 5 to 30 minutes, thereby reducing the thickness to 5 to 70 μm; and heat-curing the photosensitive composition after exposure and development.

21. A photosensitive dry film comprising a support and a photosensitive layer formed from the photosensitive composition of claim 1 on the support.

22. A photosensitive dry film according to claim 21, wherein the support is a polyester film.

23. A method of producing a printed circuit board, which comprises a laminating step of laminating a photosensitive layer of the photosensitive dry film of claim 21, and a board, an exposure step of exposing the photosensitive layer to light, a developing step which follows the exposure step, and a heat-curing step of heat-curing the photosensitive layer.

24. A method of producing a photosensitive dry film, which comprises the step of applying the photosensitive composition of claim 1 on a support, and drying the photosensitive composition to form a photosensitive layer.

25. An insulating protective coating film comprising the photosensitive composition of claim 1.

26. A printed circuit board comprising the insulating protective coating film of claim 25.

27. A printed circuit board according to claim 26, which is a flexible printed circuit board.

* * * * *